(12) United States Patent
Signoff et al.

(10) Patent No.: US 12,348,125 B2
(45) Date of Patent: Jul. 1, 2025

(54) CHARGE PUMP-ENABLED CIRCUIT PROTECTION SWITCH

(71) Applicant: Apple Inc., Cupertino, CA (US)

(72) Inventors: David M Signoff, Santa Clara, CA (US); Fei Wang, Santa Clara, CA (US); Kefei Wu, San Diego, CA (US); Song Hu, San Jose, CA (US); Morteza Nick, San Francisco, CA (US); Xiang Guan, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/099,674

(22) Filed: Jan. 20, 2023

(65) Prior Publication Data

US 2024/0250604 A1   Jul. 25, 2024

(51) Int. Cl.
*H02M 1/32* (2007.01)
*H02M 3/07* (2006.01)

(52) U.S. Cl.
CPC ............... *H02M 1/32* (2013.01); *H02M 3/07* (2013.01)

(58) Field of Classification Search
CPC ............ H02M 1/32; H02M 3/07; H02M 1/08; H03K 17/063
See application file for complete search history.

(56) References Cited

U.S. PATENT DOCUMENTS

| | | | |
|---|---|---|---|
| 5,581,454 A | 12/1996 | Collins | |
| 10,122,220 B2 | 11/2018 | Sankar | |
| 10,305,376 B1 | 5/2019 | Mooney et al. | |
| 10,686,371 B1 | 6/2020 | Lee | |
| 10,886,731 B2 | 1/2021 | Cheng | |
| 11,075,515 B2 | 7/2021 | Liu | |
| 11,112,844 B2 | 9/2021 | Sporck | |
| 11,411,492 B1 | 8/2022 | Pichler | |
| 2003/0214768 A1 | 11/2003 | Lin et al. | |
| 2004/0090267 A1* | 5/2004 | Nagamori | H03F 1/301 330/133 |
| 2007/0024341 A1* | 2/2007 | Muggler | H02M 3/07 327/520 |
| 2011/0051303 A1* | 3/2011 | Migliavacca | H02J 7/00308 361/91.5 |

(Continued)

OTHER PUBLICATIONS

Extended European Search Report for EP Application No. 23218783.1 dated May 24, 2024; 9 pgs.

*Primary Examiner* — Sibin Chen
(74) *Attorney, Agent, or Firm* — FLETCHER YODER PC

(57) ABSTRACT

Radio frequency (RF) transmitters of a device (aggressor device) may unintentionally transmit a high-power output signal to antennas of a receiving device (victim device). In some RF systems, a victim device may have no or little protection between its antennas and transistors in an integrated circuit. Performance or lifetime of the transistors may be negatively impacted due to large voltage swings that may result from the high-power signal received from the aggressor device. To prevent or mitigate impact to performance or lifetime of the transistors due to the large voltage swings, protection circuitry including switches and a direct current (DC) power source (e.g., a charge pump) may be implemented at an input of a receiver of the victim device to shunt the power from sensitive circuit components of the victim device.

20 Claims, 5 Drawing Sheets

(56) References Cited

U.S. PATENT DOCUMENTS

| | | | |
|---|---|---|---|
| 2014/0063666 A1* | 3/2014 | Kallal | H02H 3/20 |
| | | | 361/56 |
| 2015/0318852 A1 | 11/2015 | Hoogzaad et al. | |
| 2021/0036551 A1 | 2/2021 | Fan | |
| 2023/0318281 A1* | 10/2023 | Chou | H02H 3/202 |

* cited by examiner

CHARGE PUMP-ENABLED CIRCUIT PROTECTION SWITCH

BACKGROUND

The present disclosure relates generally to wireless communication, and more specifically to circuit protection in radio frequency (RF) transceivers.

RF transmitters can transmit high power levels to antennas of victim devices. In some RF systems, a victim device may not have protection between the antenna and sensitive circuit components (e.g., transistors) of an integrated circuit. Transistors may experience reduced lifetime and reduced performance (e.g., as a result of voltage drift) due to large voltage swings associated with the high power levels at the antennas. Such device stress may occur regardless of whether the victim device is turned on or off.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device includes a plurality of antennas, receive circuitry c coupled to the plurality of antennas and configured to receive a signal, the receive circuitry including one or more circuit components; a transistor coupled between the plurality of antenna and the receive circuitry, and a charge pump coupled between the plurality of antennas and the transistor, wherein an input of the charge pump is electrically coupled to a drain terminal of the transistor and an output of the charge pump is electrically coupled to a gate terminal of the transistor.

In another embodiment, an overvoltage protection circuit includes a transistor; and a charge pump coupled to an input of a receiver and a gate terminal of the transistor, the charge pump configured to enable the transistor to shunt excess power from one or more circuit components based on a power level of a received signal.

In yet another embodiment, a transceiver includes a transmitter and a receiver. The receiver includes a plurality of circuit components, a transistor, and a charge pump. An input of the charge pump is coupled to the plurality of circuit components and an output of the charge pump is coupled to a gate terminal of the transistor, and the charge pump is configured to cause the transistor to shunt power away from the plurality of circuit components based on an input signal.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
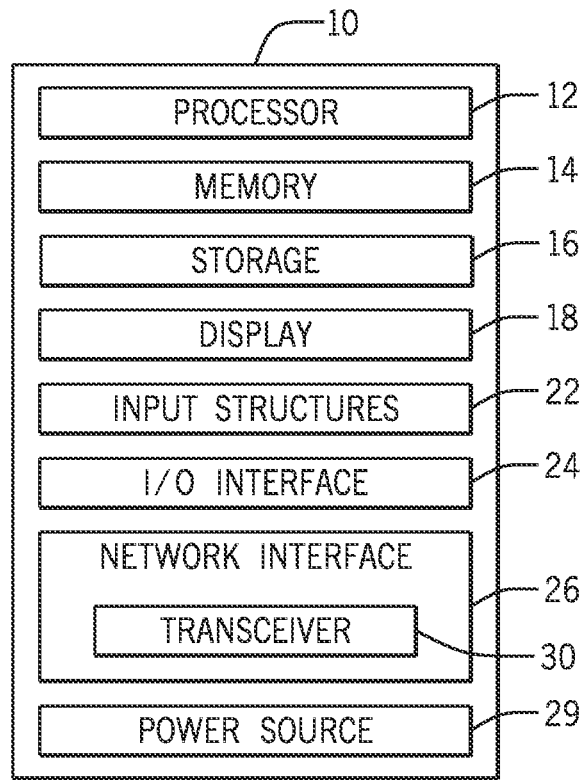
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to circuit protection in a transceiver of a radio frequency (RF) device. Transmitters of an RF device (e.g., referred to herein as aggressor devices) may unintentionally transmit large amounts of power to antennas in receiving devices (e.g., referred to herein as victim devices). For example, if an aggressor device and a victim device (e.g., two cellular phones) are near one another (e.g., within a threshold distance), and the aggressor device attempts to transmit a signal to a base station at a great distance, the aggressor device may output a large high-power signal. However, the victim device, despite not being an intended or addressed recipient, may receive at least a portion of the high-power signal. In some RF systems, the victim device may have no or little protection between its antennas and sensitive components (e.g., transistors) in an integrated circuit. The transistors may experience reduced lifetime or performance impacts due to large voltage swings that may result from receiving the high-power signal. Such stress on the transistors may occur regardless of whether or not the integrated circuit has DC power.

In some cases, one or more diodes may be disposed at an input of the RF transmitter to provide circuit protection for the victim device. As the RF signal from the transmitter exceeds diode turn-on voltage, the diode may shunt the large amounts of power from the transmitter. However, diodes large enough to sufficiently shunt the transmitter power may have a large associated capacitance. At certain frequencies (e.g., mmWave frequencies), such a large capacitance may degrade circuit performance.

To provide victim device circuit protection without creating excess capacitance, overvoltage protection circuitry including switches (e.g., a transistor, such as a metal oxide semiconductor field-effect transistors (MOSFETs)) and/or a direct current (DC) power source (e.g., a charge pump) may be implemented at an input of a receiver of a victim device to shunt incoming power from sensitive circuit components of the victim device. For example, a charge pump may be coupled to a gate of a transistor at the receiver input circuit such that the charge pump and the transistor form a feedback loop. When input power from the transmitter exceeds a threshold, the charge pump may convert the input power to a DC voltage and use the DC voltage to enable the transistor to operate as a shunt switch and shunt excess power to ground.

In this way, the charge pump and transistor may harvest energy from an aggressor RF signal (e.g., the receiver input power) to protect victim circuitry. In some embodiments, the charge pump and the transistor may be disposed such that the input of the charge pump is coupled to a drain of the transistor. In other embodiments, the charge pump and the drain of the transistor may be coupled to two separate nodes, with circuit elements between the two nodes (e.g., circuit elements that need little or no surge protection). In some embodiments, the protection circuit may include a resistance device (e.g., a resistor) coupled to the gate of the transistor that may, when the power signal reaches a threshold level, cause the charge pump to supply gate voltage to the transistor, turning the transistor on and shunting power away from sensitive circuit components of the victim circuitry.

In some embodiments, one or more overvoltage protection circuits may be coupled to the gate of the transistor. For example, an analog or digital buffer may be coupled to the gate of the transistor and a second transistor may be coupled to the output of the buffer. Another resistor may be coupled to the source node of the second transistor. The second transistor may be controlled by the charge pump, wherein the charge pump may cause the second transistor to turn off a bias voltage to the transistor via the buffer. There may be an overvoltage protection circuit for each component to be protected at the receiver input. For example, if there is one transistor to be protected at the receiver input, one overvoltage protection circuit may be used. If there are two transistors to be protected at the receiver input, two overvoltage protection circuits may be used (e.g., one at each transistor to be protected), and so on.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, Long Term Evolution (LTE®) cellular network, Long Term Evolution License Assisted Access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
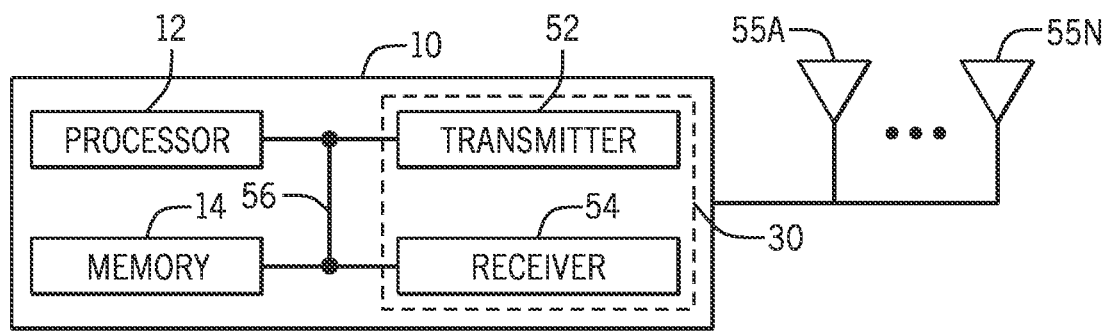
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna or antennas 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
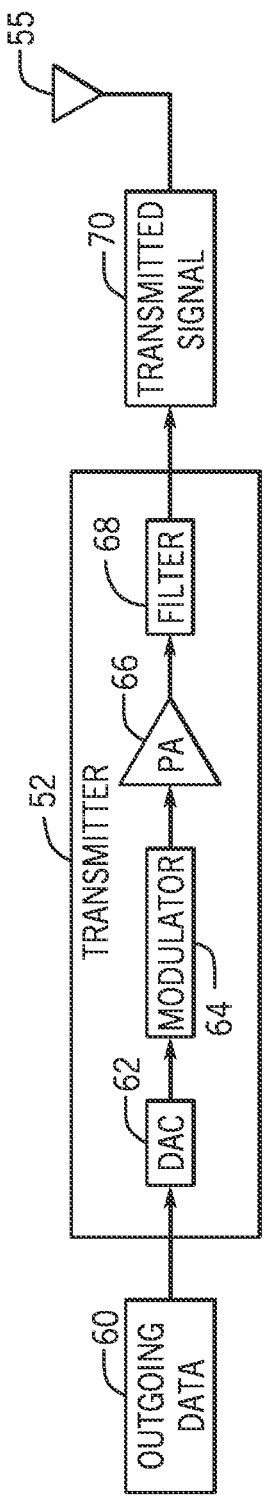
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

The power amplifier 66 and/or the filter 68 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

The transmitter 52 may, in some cases, transmit the transmitted signal 70 at a high power level. For instance, if the transmitter 52 is attempting to transmit the transmitted signal 70 to a base station at a significant distance. However, a nearby electronic device 10 may receive the transmitted signal 70, which may impact the performance of the nearby electronic device 10 (e.g., may reduce the lifetime of components of the electronic device 10 or may negatively impact performance of the electronic device 10). In some cases, one or more diodes may be disposed at an input of the transmitter 52 to provide circuit protection for the victim device. As the transmitted signal 70 exceeds diode turn-on voltage, the diode may shunt the large amounts of power associated with the transmitted signal 70. However, diodes large enough to sufficiently shunt the transmitter power may have a large associated capacitance. At certain frequencies (e.g., mmWave frequencies), a large capacitance may degrade circuit performance.

Figure 4:
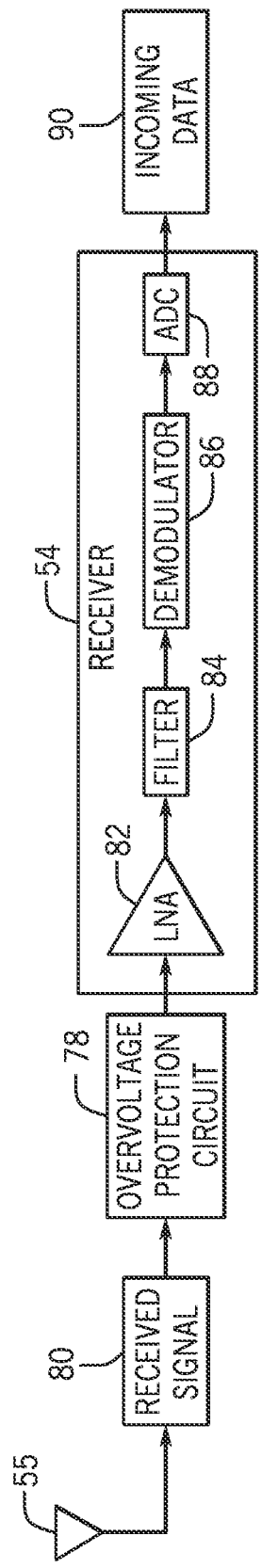
FIG. 4 is a schematic diagram of a receiver of the electronic device of FIG. 1, according to embodiments of the present disclosure.

FIG. 4 is a schematic diagram of the receiver 54 (e.g., receive circuitry), according to embodiments of the present disclosure. The receiver 54 may include an overvoltage protection circuit 78 coupled between the antennas 55 and components of the receiver 54 (e.g., LNA 82, transistors, and so on). As will be explained in greater detail below, the overvoltage protection circuit 78 may provide overvoltage protection to mitigate performance impacts to the receiver 54 and/or components thereof. As illustrated, the receiver 54 may receive received signal 80 from the one or more antennas 55 in the form of an analog signal. A low noise amplifier (LNA) 82 may amplify the received analog signal to a suitable level for the receiver 54 to process. A filter 84 (e.g., filter circuitry and/or software) may remove undesired noise from the received signal, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. The low noise amplifier 82 and/or the filter 84 may be referred to as part of the RFFE, and more specifically, a receiver front end (RXFE) of the electronic device 10.

A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received signal 80 via the one or more antennas 55. For example, the receiver 54 may include a mixer and/or a digital down converter. While the overvoltage protection circuit 78 is illustrated as being external to the receiver 54, in some embodiments, the overvoltage protection circuit 78 may be part of the receiver 54, or may be part of the transceiver 30.

Figure 5:
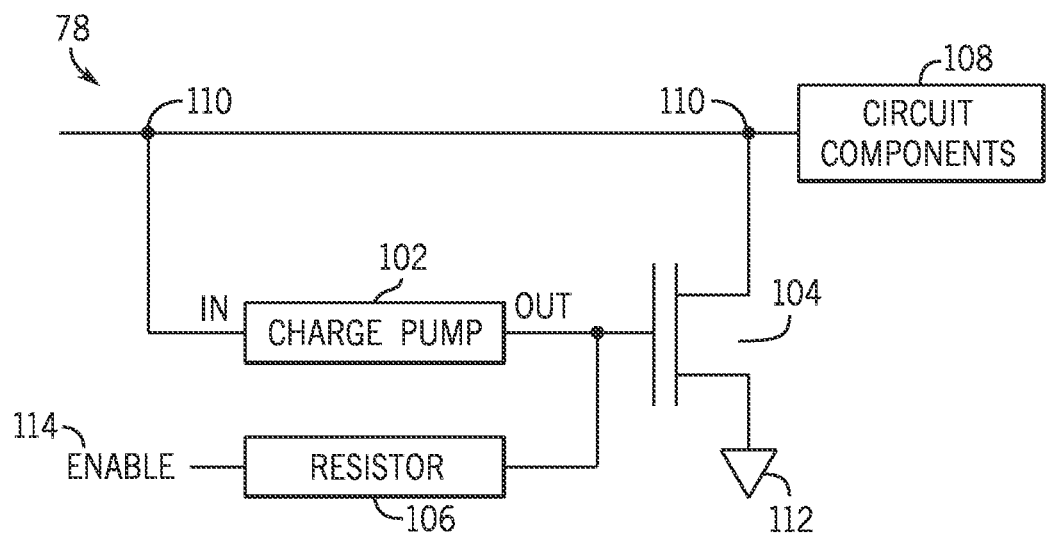
FIG. 5 is a schematic diagram of an overvoltage protection circuit for the receiver of FIG. 4, according to an embodiment of the present disclosure.

FIG. 5 is a schematic diagram of an overvoltage protection circuit 78, according to an embodiment of the present disclosure. The overvoltage protection circuit 78 includes a charge pump 102 (e.g., a voltage-multiplying charge pump), a transistor 104, a resistance device (e.g., a resistor 106), and circuit components 108. It should be noted that, while the transistor 104 is discussed with respect to the overvoltage protection circuit 78, any suitable switch capable of operating as a shunt switch may be used.

The overvoltage protection circuit 78 may be disposed at the input of the receiver 54 (e.g., between input antennas 55 and the LNA 82) as illustrated with respect to FIG. 4. The circuit components 108 may be vulnerable or sensitive to large voltage swings. For example, the circuit components 108 may include transistors or any other suitable circuitry that may experience reduced lifetime or negative performance impacts (e.g., permanent voltage drift) if exposed to high-power signals from the transmitter 52 without overvoltage protection. A drain terminal 116 of the transistor 104 is coupled to the charge pump 102 and the circuit components 108 via a node 110, such that when the transistor 104 is turned on (e.g., activated), the transistor 104 may shunt power away from the circuit components 108 to ground 112 via a source terminal 118 of the transistor 104.

An input of the charge pump 102 is coupled to the drain terminal 116 of the transistor 104 at the node 110, while an output of the charge pump 102 is coupled to a gate terminal 120 of the transistor 104. In this way, the voltage of the charge pump 102 may be based on the voltage of the received signal 80. When the receiver 54 receives the received signal 80 from the transmitter 52, the received signal 80 may be delivered to the circuit components 108 if the power level associated with the received signal 80 is below a threshold (e.g., less than 20 decibel milliwatts (dBm), less than 10 dBm, less than 5 dBm, less than 2 dBm, less than 1 dBm, greater than or equal to 20 dBm, and so on). Tat is, if the power level associated with the received signal 80 is below the threshold, the charge pump 102 may act as an open circuit, and block the received signal 80 from supplying voltage to the gate of the transistor 104.

If the power level associated with the received signal 80 is above the threshold (e.g., 0 dBm to 10 dBm), the charge pump 102 may convert the AC voltage of the received signal 80 to a DC voltage, and provide the DC voltage as a gate voltage to the gate 120 of the transistor 104, causing the transistor 104 to turn on or activate. When the transistor 104 is turned on, it may operate as a shunt switch, and shunt the power from the received signal 80 to the ground 112, preventing excess power from reaching and potentially impacting the performance of the circuit components 108. When the transistor 104 is shunting power to the ground 112, it may also draw the power of the received signal 80 away from the charge pump 102, reducing the charge of the charge pump 102, which may reduce the gate voltage of transistor 104, thus causing the transistor 104 to shunt less power from the circuit components 108. In this way, the charge pump 102 and the transistor 104 may form a negative feedback loop.

If the transmitter 52 includes an additional shunt switch, the charge pump 102 may be disposed in parallel with the additional switch control, which may act as an enable switch and reduce or minimize capacitance in the RF line. In this scenario, the resistor 106 may be coupled between the additional switch control and the gate terminal 120 of the transistor 104, as illustrated in FIG. 5. In the configuration illustrated with respect to FIG. 5, the transistor 104 may be turned on if an enable signal 114 (e.g., of the additional switch control) is high or if the power level of the received signal 80 is above the threshold (e.g., if the power level of the received signal 80 is high enough to activate the charge pump 102). The resistor 106 may be selected and/or sized to provide a resistance great enough such that the charge pump 102 sources requested current from the additional switch control through the resistor 106. In this way, the overvoltage protection circuit 78 may harvest the energy of the received signal 80 to provide overvoltage protection for vulnerable components of the receiver 54.

Figure 6:
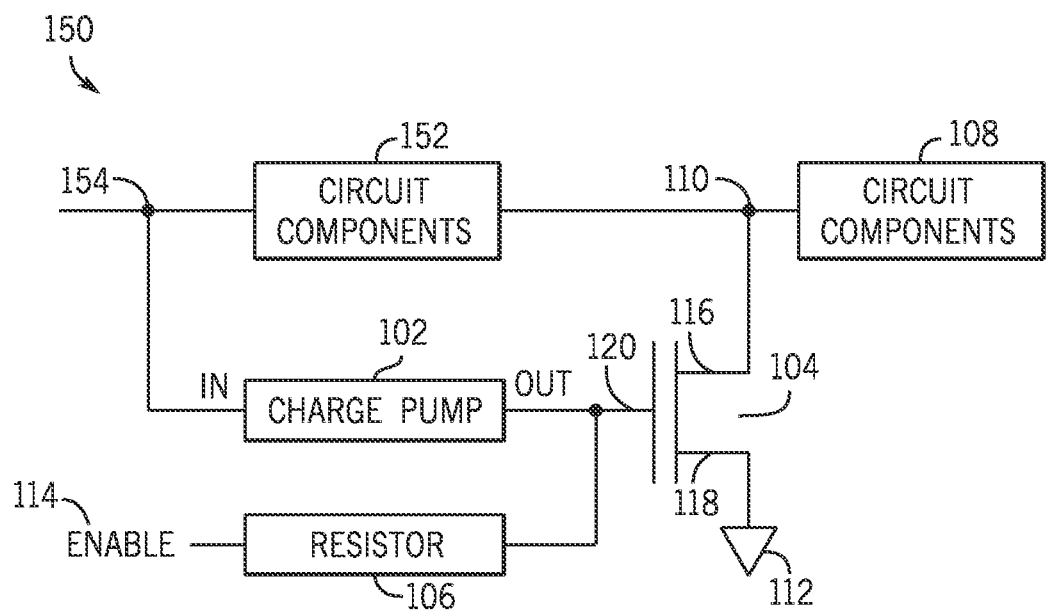
FIG. 6 is a schematic diagram of an overvoltage protection circuit having an additional set of circuit components disposed between an input of a charge pump and a drain terminal of a transistor, according to an embodiment of the present disclosure.

FIG. 6 is a schematic diagram of an overvoltage protection circuit 150, according to an embodiment of the present disclosure. As may be appreciated, the overvoltage protection circuit 150 is an alternative embodiment and may operate similarly to the overvoltage protection circuit 78. The charge pump 102 and/or the resistor 106 may turn on the transistor 104, causing the transistor 104 to shunt power to the ground 112 away from the circuit components 108. The charge pump 102 may harvest energy from the received signal 80 to turn on and adjust the gate voltage of the transistor 104. The overvoltage protection circuit 150 may include circuit components 152. The circuit components 152 be less vulnerable to the voltage swings caused by the received signal 80. Accordingly, the circuit components 152 may be disposed between the antennas 55 of the receiver 54 and the transistor 104 without incurring negative performance impacts due to the voltage swings of the received signal 80.

In such a configuration, the input of the charge pump 102 is coupled to the circuit components 152 via node 154 and the drain terminal of the transistor 104 is coupled to the circuit components 152 via the node 110. Coupling the input of the charge pump 102 to the circuit components 152 and the drain terminal of the transistor 104 to the circuit components via separate nodes may be advantageous in certain cases, such as if one node has higher swing (e.g., faster activation of the charge pump 102) while another node has higher impedance (e.g., more effective shunt switching).

Figure 7:
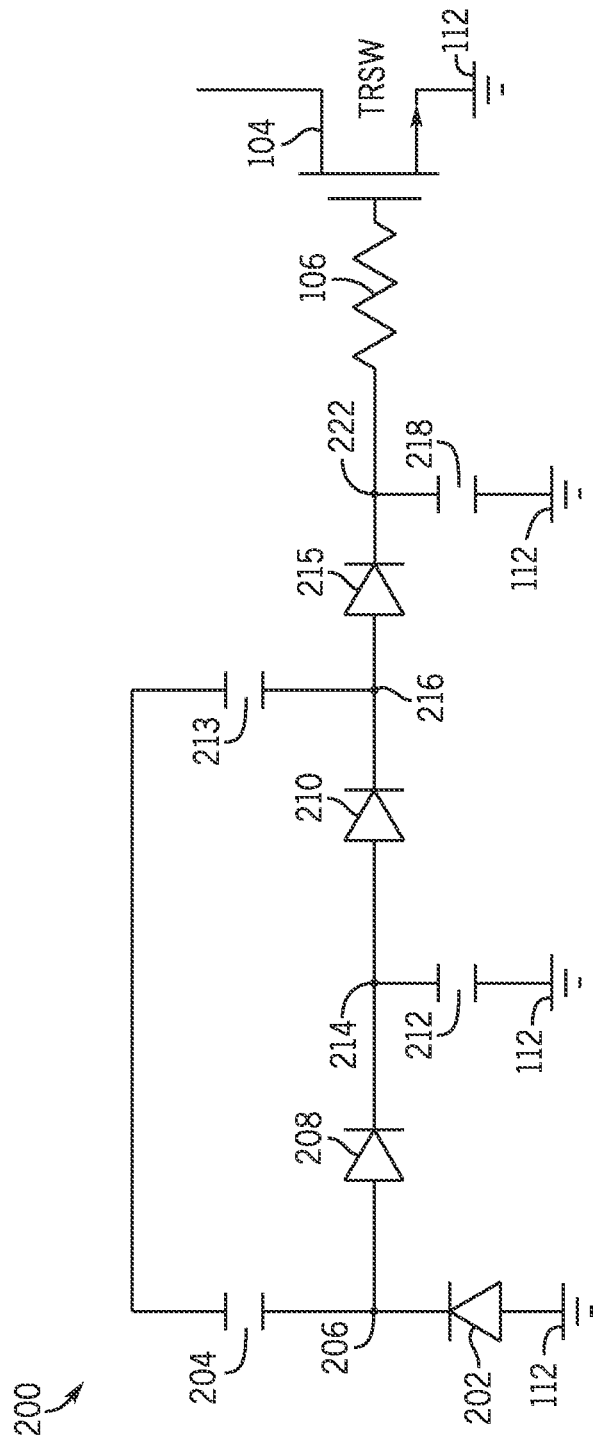
FIG. 7 is a circuit diagram of the charge pump.

FIG. 7 is a circuit diagram of the charge pump 102. The charge pump may include a diode 202, a capacitor 204, and a diode 208 coupled at a node 206, such that the output of the diode 202 and the input of the diode 208 are coupled at the node 206. The diode 208, a capacitor 212, and a diode 210 are coupled at a node 214, such that the output of the diode 208 and the input of the diode 210 are coupled to the node 214, and the capacitor 212 is coupled between the node 214 and the ground 112. The diode 210, a capacitor 213, and a diode 215 are coupled at a node 216, such that the output of the diode 210 and the input of the diode 214 are coupled to the node 216, and the capacitor 213 is coupled between the node 216 and the capacitor 204. The diode 214, a capacitor 218, and the resistor 106 are coupled to a node 222, such that the output of the diode 214 is coupled to the node 222, and the capacitor is coupled between the node 222 and the ground 112. The resistor 106 is coupled between the node 222 and the gate of the transistor 104.

Figure 8:
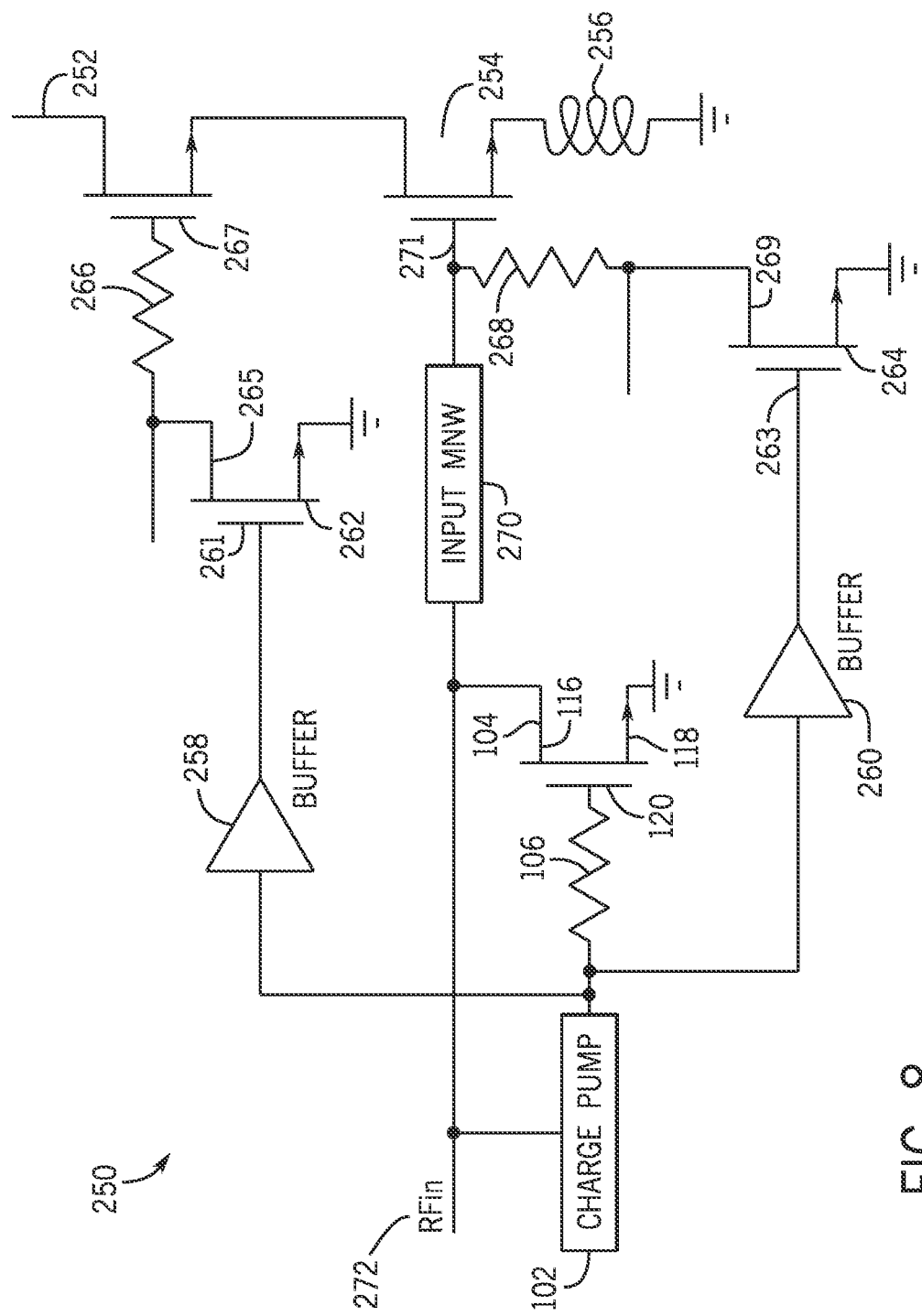
FIG. 8 is a circuit diagram of an overvoltage protection circuit that mitigates voltage swings in the receiver of FIG. 4, according to an embodiment of the present disclosure.

FIG. 8 is a circuit diagram of an overvoltage protection circuit 250 that may mitigate voltage swings in the receiver 54, according to an embodiment of the present disclosure. The overvoltage protection circuit 205 includes the charge pump 102, the resistor 106, and the transistor 104 as described with respect to FIGS. 5 and 6. Similarly to FIGS. 5 and 6, the charge pump 102 may turn the transistor 104 on by harvesting the power of the received signal 80, converting the received signal 80 to a DC voltage, and supplying the DC voltage to the transistor 104 as a gate voltage. The overvoltage protection circuit 250 includes components vulnerable to voltage swings, such as a load transistor 252, a load transistor 254, and an inductor 256. To mitigate voltage swing at the load transistors 252 and 254, a buffer (e.g., 258, 260) and a switch (e.g., the transistors 262, 264) may be coupled between the output of the charge pump and the transistors 252 and 254. While 262 and 264 are discussed as transistors, it should be noted that 262 and 264 may include any appropriate switching device. Additionally, the buffers 258 and 260 may include digital or analog buffers, as may be appropriate.

An input of the buffer 258 is coupled to the output of the charge pump 102, and an output of the buffer 258 is coupled to a gate terminal 120 of the transistor 262. A resistance device (e.g., a resistor 266) is coupled between a drain terminal 265 of the transistor 262 and a gate terminal 267 of the load transistor 252. The output of the charge pump 102 may control (e.g., turn on) the transistor 262 via the buffer 258 (e.g., by passing a voltage signal through the buffer 258), which may bias the load transistor 252 through the resistor 266. In this way, the charge pump 102, the buffer 258, the transistor 262, and the resistor 266 may bias the load transistor 252 to reduce a voltage swing at the load transistor 252 and reduce or prevent a performance impact on the load transistor 252.

Similarly, an input of the buffer 260 is coupled to the output of the charge pump 102, and an output of the buffer 260 is coupled to the gate terminal 263 of the transistor 264. A resistance device (e.g., a resistor 268) is coupled between a drain terminal 269 of the transistor 264 and a gate terminal 271 of the load transistor 254. The output of the charge pump 102 may control (e.g., turn on) the transistor 264 via the buffer 260 (e.g., by passing a voltage signal through the buffer 260), which may bias the load transistor 254 through the resistor 268. In this way, the charge pump 102, the buffer 260, the transistor 264, and the resistor 268 may bias the load transistor 254 to reduce a voltage swing at the load transistor 254 and reduce or prevent a performance impact on the load transistor 254. The overvoltage protection circuit 250 also includes an impedance matching network 270. The impedance matching network may match an impedance at the gate terminal 271 of the load transistor 254 to an impedance of the received signal 80 at the input 272. It should be noted that, while two load transistors 252, 254 are shown, the overvoltage protection circuit 250 may be implemented in a circuit with any appropriate number of load transistors (e.g., 3 or more, 5 or more, 10 or more, 100 or more). To provide overvoltage protection, one buffer and one transistor may be included for each load transistor.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device, comprising:
   a plurality of antennas;
   receive circuitry coupled to the plurality of antennas and comprising one or more circuit components; and
   an overvoltage protection circuit comprising:
      a first transistor coupled between the plurality of antennas and the receive circuitry;
      a charge pump coupled between the plurality of antennas and the first transistor, wherein an input of the charge pump is electrically coupled to a drain terminal of the first transistor and an output of the charge pump is electrically coupled to a gate terminal of the first transistor; and
      a first buffer coupled between the output of the charge pump and a gate terminal of a second transistor, wherein a drain terminal of the second transistor is coupled to a gate terminal of a load transistor; and
      a second buffer coupled between the output of the charge pump and a second gate terminal of a third transistor.

2. The electronic device of claim 1, wherein the charge pump is configured to cause the first transistor to shunt excess power from the one or more circuit components of the receive circuitry based on a signal received at the receive circuitry.

3. The electronic device of claim 2, wherein the charge pump is configured to activate the first transistor based on the signal comprising a voltage greater than a threshold voltage.

4. The electronic device of claim 3, wherein the charge pump is configured to convert the signal to a direct current (DC) voltage based on the signal comprising the voltage greater than the threshold voltage.

5. The electronic device of claim 4, wherein the charge pump is configured to provide the DC voltage to the gate terminal of the first transistor.

6. The electronic device of claim 1, wherein the charge pump is configured to turn on the second transistor via the first buffer, and the second transistor is configured to bias the load transistor to reduce a voltage swing at the load transistor.

7. The electronic device of claim 1, wherein the receive circuitry comprises a resistor coupled between the drain terminal of the second transistor and the gate terminal of the load transistor.

8. The electronic device of claim 1, wherein a second drain terminal of the third transistor is coupled to a second gate terminal of a second load transistor.

9. The electronic device of claim 1, comprising an impedance matching network disposed between the input of the charge pump and the gate terminal of the load transistor.

10. An overvoltage protection circuit, comprising:
    a first transistor;
    a charge pump coupled to an input of a receiver and a gate terminal of the first transistor, the charge pump configured to enable the first transistor to shunt excess power from one or more circuit components of the receiver based on a power level of a received signal;
    a buffer coupled to an output of the charge pump; and
    a second transistor coupled to the output of the buffer, wherein a drain terminal of the second transistor is electrically coupled to a gate terminal of a load transistor; and
    a second buffer coupled between the output of the charge pump and a second gate terminal of a third transistor.

11. The overvoltage protection circuit of claim 10, comprising a resistor coupled to the gate terminal of the first transistor and configured to enable the first transistor to shunt the excess power.

12. The overvoltage protection circuit of claim 10, wherein the charge pump is configured to turn on the second transistor via the buffer by passing a voltage signal to the second transistor through the buffer, and the second transistor is configured to bias the load transistor to reduce a voltage swing at the load transistor.

13. The overvoltage protection circuit of claim 10, comprising a resistor coupled between the drain terminal of the second transistor and the gate terminal of the load transistor.

14. The overvoltage protection circuit of claim 10, comprising an impedance matching network electrically coupled to the drain terminal of the first transistor and the gate terminal of the load transistor, the impedance matching network configured to match an impedance at the gate terminal of the load transistor to an impedance of the received signal.

15. The overvoltage protection circuit of claim 10, wherein the charge pump is configured to enable the first transistor to shunt the excess power by converting the received signal into a direct current (DC) signal, and provide the DC signal to the first transistor as a gate voltage.

16. The overvoltage protection circuit of claim 10, wherein a second drain terminal of the third transistor is coupled to a gate terminal of a second load transistor.

17. A transceiver, comprising:
    a transmitter; and
    a receiver comprising
       a plurality of circuit components, and
       an overvoltage protection circuit comprising:
          a first transistor,
          a charge pump having an input coupled to the plurality of circuit components and an output coupled to a gate terminal of the first transistor, the charge pump being configured to cause the first transistor to shunt power away from the plurality of circuit components;

a buffer coupled to the output of the charge pump;
a second transistor coupled to an output of the buffer, wherein a drain terminal of the second transistor is electrically coupled to a gate terminal of a load transistor; and
a second buffer coupled between the output of the charge pump and a second gate terminal of a third transistor.

18. The transceiver of claim 17, wherein the charge pump is configured to convert an input signal into a direct current (DC) voltage and provide the DC voltage to the first transistor.

19. The transceiver of claim 17, wherein the plurality of circuit components comprises at least a first load transistor and an inductor.

20. The transceiver of claim 17, wherein the charge pump comprises a voltage multiplying charge pump.

\* \* \* \* \*